United States Patent
Forthmann et al.

(10) Patent No.: US 9,753,111 B2
(45) Date of Patent: Sep. 5, 2017

(54) VISUAL PRE-SCAN PATIENT INFORMATION FOR MAGNETIC RESONANCE PROTOCOL

(71) Applicant: KONINKLIJKE PHILIPS N.V., Eindhoven (NL)

(72) Inventors: Peter Forthmann, Eindhoven (NL); Sascha Krueger, Eindhoven (NL); Tim Nielsen, Eindhoven (NL); Jurgen Erwin Rahmer, Eindhoven (NL); Peter Vernickel, Eindhoven (NL); Peter Boernert, Eindhoven (NL); Ulrich Katscher, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 72 days.

(21) Appl. No.: 14/895,319

(22) PCT Filed: Jun. 7, 2014

(86) PCT No.: PCT/IB2014/062050
§ 371 (c)(1),
(2) Date: Dec. 2, 2015

(87) PCT Pub. No.: WO2014/195924
PCT Pub. Date: Dec. 11, 2014

(65) Prior Publication Data
US 2016/0109545 A1    Apr. 21, 2016

Related U.S. Application Data

(60) Provisional application No. 61/832,395, filed on Jun. 7, 2013.

(51) Int. Cl.
*G06K 9/00* (2006.01)
*G01R 33/54* (2006.01)
(Continued)

(52) U.S. Cl.
CPC ............ *G01R 33/543* (2013.01); *G01B 11/24* (2013.01); *G01G 19/44* (2013.01); *G01R 33/307* (2013.01);
(Continued)

(58) Field of Classification Search
None
See application file for complete search history.

(56) References Cited

U.S. PATENT DOCUMENTS

| 5,073,752 | A   |   | 12/1991 | De Meester et al. |
|-----------|-----|---|---------|-------------------|
| 6,937,696 | B1  | * | 8/2005  | Mostafavi ............ A61B 5/7292 378/65 |
| 7,433,503 | B2  |   | 10/2008 | Cherek et al. |
| 2002/0082494 | A1 |   | 6/2002 | Balloni et al. |
| 2002/0193685 | A1 | * | 12/2002 | Mate .................... A61N 5/1049 600/424 |
| 2004/0081341 | A1 |   | 4/2004 | Cherek et al. |
| 2008/0118122 | A1 | * | 5/2008 | Sirohey ................ G06T 7/0012 382/128 |
| 2009/0154783 | A1 |   | 6/2009 | Bystrov et al. |
| 2010/0002839 | A1 | * | 1/2010 | Yokota .................... A61B 6/12 378/98.12 |

(Continued)

FOREIGN PATENT DOCUMENTS

JP      06114048 A      4/1994
JP   2006187422 A      7/2006

OTHER PUBLICATIONS

Robert Grimm et al: "Markerless estimation of patient orientation, posture and pose using range and pressure imaging ; For automatic patient setup and scanner initialization in tomographic imaging", International Journal of Compüter Assisted Radiology and Surgery; A Journal FDR Interdisciplinary Research, Development and Applications of Image Guided Diagnosis and Therapy, Springer, Berlin, DE, vol. 7, No. 6, May 15, 2012 (May 15, 2012), pp. 921-929, XP035132546.

*Primary Examiner* — Shervin Nakhjavan

(57) ABSTRACT

A system and method determines an isocenter for an imaging scan. The method includes receiving, by a control panel, patient data generated by at least one sensor, the patient data corresponding to dimensions of a body of a patient. The method includes generating, by the control panel, model data as a function of the patient data, the model data representing the body of the patient. The method includes receiving, by the control panel, a target location on the model data, the target location corresponding to a desired position on the body of the patient for performing the imaging scan. The method includes determining, by the control panel, an isocenter for the imaging scan as a function of the target location.

20 Claims, 3 Drawing Sheets

(51) Int. Cl.
*G01B 11/24* (2006.01)
*G01G 19/44* (2006.01)
*G01R 33/30* (2006.01)
*G06T 7/00* (2017.01)
*H04N 5/225* (2006.01)
*G06T 7/73* (2017.01)
*G01R 33/28* (2006.01)

(52) U.S. Cl.
CPC .............. *G06T 7/0012* (2013.01); *G06T 7/73* (2017.01); *H04N 5/225* (2013.01); *G01R 33/28* (2013.01); *G06T 2200/04* (2013.01); *G06T 2207/10088* (2013.01); *G06T 2207/30196* (2013.01)

(56) References Cited

U.S. PATENT DOCUMENTS

| | | | | |
|---|---|---|---|---|
| 2010/0266099 | A1* | 10/2010 | Busch | A61N 5/1048 378/65 |
| 2012/0004518 | A1* | 1/2012 | D'Souza | A61B 5/1135 600/301 |
| 2012/0271156 | A1* | 10/2012 | Bi | A61B 5/055 600/415 |
| 2012/0283546 | A1* | 11/2012 | Zuehlsdorff | A61B 5/055 600/410 |

\* cited by examiner

VISUAL PRE-SCAN PATIENT INFORMATION FOR MAGNETIC RESONANCE PROTOCOL

CROSS REFERENCE TO RELATED APPLICATIONS

This application is a U.S. national phase application of International Application No. PCT/IB2014/062050, filed on Jun. 7, 2014, which claims the benefit of U.S. provisional Application Ser. No. 61/832,395 filed on Jun. 7, 2013 and is incorporated herein by reference.

A magnetic resonance imaging (MRI) device is generally used to visualize internal structures of a body. Specifically, MRI makes use of the property of nuclear magnetic resonance (NMR) to image nuclei of atoms inside the body. A conventional MRI device typically includes a retractable patient table in which a patient lies. The patient is moved within the MRI device such that a large, powerful magnet generates a magnetic field that is used to align the magnetization of at least some atomic nuclei in the body, and radio frequency magnetic fields are applied to systematically alter the alignment of this magnetization. This causes the nuclei to produce a rotating magnetic field detectable by the scanner. This information is recorded to construct an image of the scanned area of the body.

The conventional MRI device includes a conventional control panel including control buttons that allow an operator to move the patient table when the patient lies thereon. Initially, after the patient has lain on the patient table, the operator performs a manual alignment with a patient/laser cross-hair marker before letting the bed travel to the isocenter (e.g., the point in space through which the central beam of radiation is to pass). This is performed with a manual visual identification by the operator. Once the patient is moved into the MRI device at the designated isocenter, the operator moves to an operator room in which the MRI device may be remotely controlled. The operator may make further incremental movements for a radiation isocenter to be found. The operator may further be required to manually provide dimensions or other data related to the patient as well as manually determine the isocenter. Although these steps are considered to be preliminary and/or deemed trivial to the overall process, these steps add significantly to the overall time for the procedure.

Accordingly, it can be is desirable to reduce the time necessary to prepare the patient for the scan performed by the MRI device. Thus, there is a need for a system that provides a more efficient manner in which the MRI device is prepared for the scan to be performed.

The exemplary embodiments relate to a system and method for determining an isocenter for an imaging scan. For example, an exemplary method can include receiving, by a control panel, patient data generated by at least one sensor, the patient data being indicative of dimensions of a body of a patient; generating, by the control panel, model data as a function of the patient data, the model data representing the body of the patient; receiving, by the control panel, a target location on the model data, the target location being indicative of a desired position on the body of the patient for performing an imaging scan; and determining, by the control panel, an isocenter for the imaging scan as a function of the target location.

Figure 1:
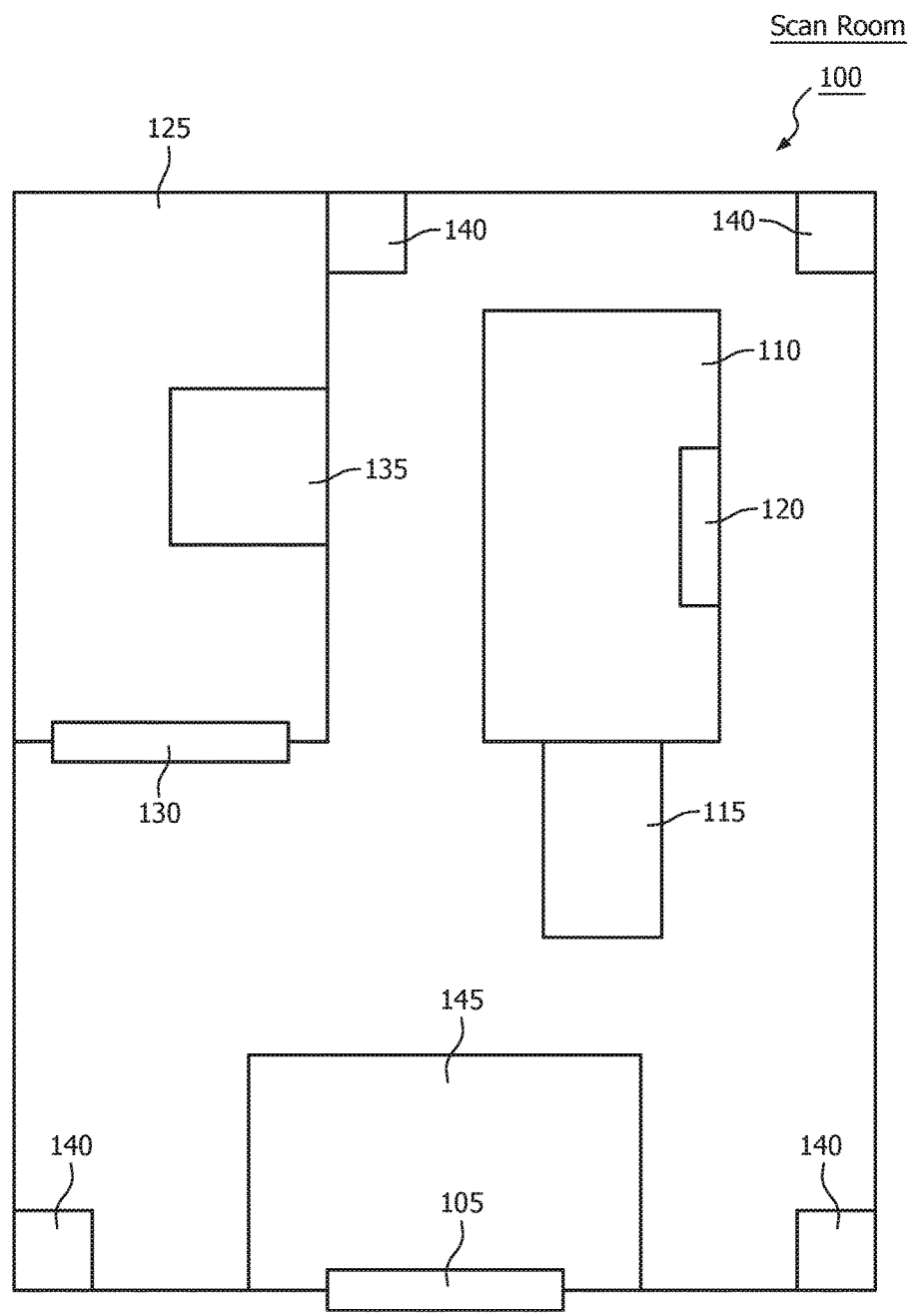
FIG. 1 shows a system for a scan room according to the exemplary embodiments.

The exemplary embodiments may be further understood with reference to the following description of the exemplary embodiments and the related appended drawings, wherein like elements are provided with the same reference numerals. The exemplary embodiments are generally related to a system and method of providing patient data from a visual pre-scan of the patient. Specifically, the patient data can be determined for a magnetic resonance imaging (MRI) procedure via at least one sensor configured to capture the patient data prior to performing a scan. The patient data, the pre-scan, the MRI procedure, the sensors, and a related method will be explained in further detail below.

FIG. 1 shows an exemplary system for a scan room 100 according to the exemplary embodiments. The scan room 100 is used for a patient who will be imaged. For example, the patient may require an MRI to be performed on a body portion. The scan room 100 includes substantially similar components of a conventional scan room. For example, the scan room 100 includes an access door 105, a MRI device 110, a patient table 115, an operator room 125, an access door 130 to the operator room 125, and an imaging device 135. According to the exemplary embodiments, the scan room 100 further includes a control panel 120 on the MRI device 110, imaging sensors 140, and a weight sensor 145.

According to the exemplary embodiments, the imaging sensors 140 provide data for a visual pre-scan of the patient. That is, the pre-scan relates to an operation that is performed prior to the imaging scan to be performed on the patient. Those skilled in the art will understand that for the imaging scan to be performed, the patient should be properly aligned with components of the MRI device 110. Thus, the imaging sensors 140 provide the data for the visual pre-scan that relates to the alignment of the components of the MRI device 110, specifically for positioning the patient at the isocenter.

The imaging sensors 140 are configured to capture images of the patient upon entering the scan room 100. Specifically, when the patient enters through the access door 105, the imaging sensors 140 begin to capture the images. The imaging sensors 140 may be configured to automatically capture the images or manually be activated to capture the images. For example, the imaging sensors 140 may be configured to detect when the patient has entered the scan room 100 via the access door 105. Accordingly, the imaging sensors 140 may operate in a low power consumption mode in which the scan room 100 is continuously monitored. Therefore, when the patient enters the scan room 100, the imaging sensors 140 may determine that the patient has indeed entered the scan room 100 and begin capturing the images. In another example, the operator may activate the imaging sensors 140 when the patient has entered the scan room 100 via the access door 105. In order to distinguish between the operator and the patient, the imaging sensors 140 are further configured with dimensional data of the operator. For example, prior to the patient entering the scan room 100, the operator may already be present. The imaging sensors 140 may capture images of the operator or determine operator data such that the patient data may be separated and identified when the patient data is eventually captured by the imaging sensors 140. In a specific exemplary embodiment, the imaging sensors 140 may store operator related data such that when an image is captured in which the operator and the patient are both present, the operator may be determined between the two and the patient data may be isolated.

The imaging sensors 140 capture the images of the patient to generate a model of the patient. Specifically, the images provide the patient data related to dimensions and relative size of the patient to generate the model. The imaging sensors 140 may be of any type. In a first example, the imaging sensors 140 may be conventional imagers such as a camera. The camera captures images of the patient at a plurality of angles such that the model of the patient is capable of being rendered. Accordingly, the camera may be a two-dimensional imager that captures two-dimensional images. Through capturing a plurality of images at various angles (to provide the third dimension), a three-dimensional model of the patient can be generated. In another example, the imaging sensors 140 may be a three-dimensional imager. That is, the three-dimensional imager may capture images having a depth component thereto. Accordingly, the three-dimensional imager provides at least one three-dimensional image for the three-dimensional model to be generated.

It should be noted that the imaging sensors 140 capturing images is only exemplary. The imaging sensors 140 may also represent any type of sensor that is capable of capturing data such that the model of the patient can be generated. For example, the sensor may be a heat sensor. Those skilled in the art will understand that peripheries of a person may have decreased temperature with respect to a core of the person. Thus, using heat generation data, a model of the patient may be generated. In another example, the sensor may be a light sensor. When the patient enters the scan room 100, the light sensors may determine changes in lighting conditions to surrounding areas of the scan room 100 (e.g., shadowing). Through known locations of the light sensor and the patient, the patient data may be determined from the light sensor data. In yet another example, the sensor may be a depth sensor. The depth sensor may provide an additional dimensional analysis to the two-dimensional captured images of the imaging sensors 140. Thus, the scan room 100 may include any of the above described types of sensors in any combination. That is, the scan room 100 may include at least one imaging sensor 140 (including the different types described above), at least one heat sensor, at least one light sensor, at least one depth sensor, etc. Those skilled in the art will understand that the various types of sensors provide additional data that is used to more accurately generate the model of the patient.

As shown in FIG. 1, there can be a plurality of imaging sensors 140. For example, four imaging sensors 140 are shown in FIG. 1. The imaging sensors 140 are disposed at predetermined locations around the scan room 100 such that sufficient images are captured of the patient upon entering the scan room 100. For example, the imaging sensors 140 may be disposed at varying heights along walls of the scan room 100. However, it should be noted that the use of four imaging sensors 140 is only exemplary. According to another exemplary embodiment, the scan room 100 may include at least one imaging sensor 140. For example, as discussed above, if the imaging sensor is a three-dimensional imager, only a single imaging sensor 140 may be required. However, to increase the probability that sufficient images are captured for the model of the patient to be generated, an increased number of imaging sensors 140 may be used.

The scan room 100 may further include the weight sensor 145. As illustrated in FIG. 1, the weight sensor 145 may be disposed adjacent to the access door 105. Specifically, the weight sensor 145 covers a portion of a floor of the scan room 100 near the access door 105. Thus, when the patient enters the scan room 100, the weight sensor 145 determines the weight of the patient. The weight of the patient allows for the model of the patient to be more accurate, particularly when combined with the images captured by the imaging sensors 140. If the operator should also be standing on the weight sensor 145, the weight sensor 145 may be configured to subtract the known weight of the operator to determine the weight of the patient. It should be noted that the weight sensor 145 may be disposed along an entirety of the floor of the scan room 100. Thus, the weight of the various components such as the MRI device 110 may be removed (e.g., tared) so that the weight of the patient is determined. Again, in this exemplary embodiment, the weight of the operator may be known and also subtracted.

The data (e.g., captured images, determined weight, etc.) is provided to a processing unit such as the control panel 120. The imaging sensors 140 and the weight sensor 145 are components of a network (e.g., local area network, private area network, etc.) in which these components are in a wired or wireless connection to other components, specifically the control panel 120. The control panel 120 receives the data to generate the model of the patient.

Figure 2:
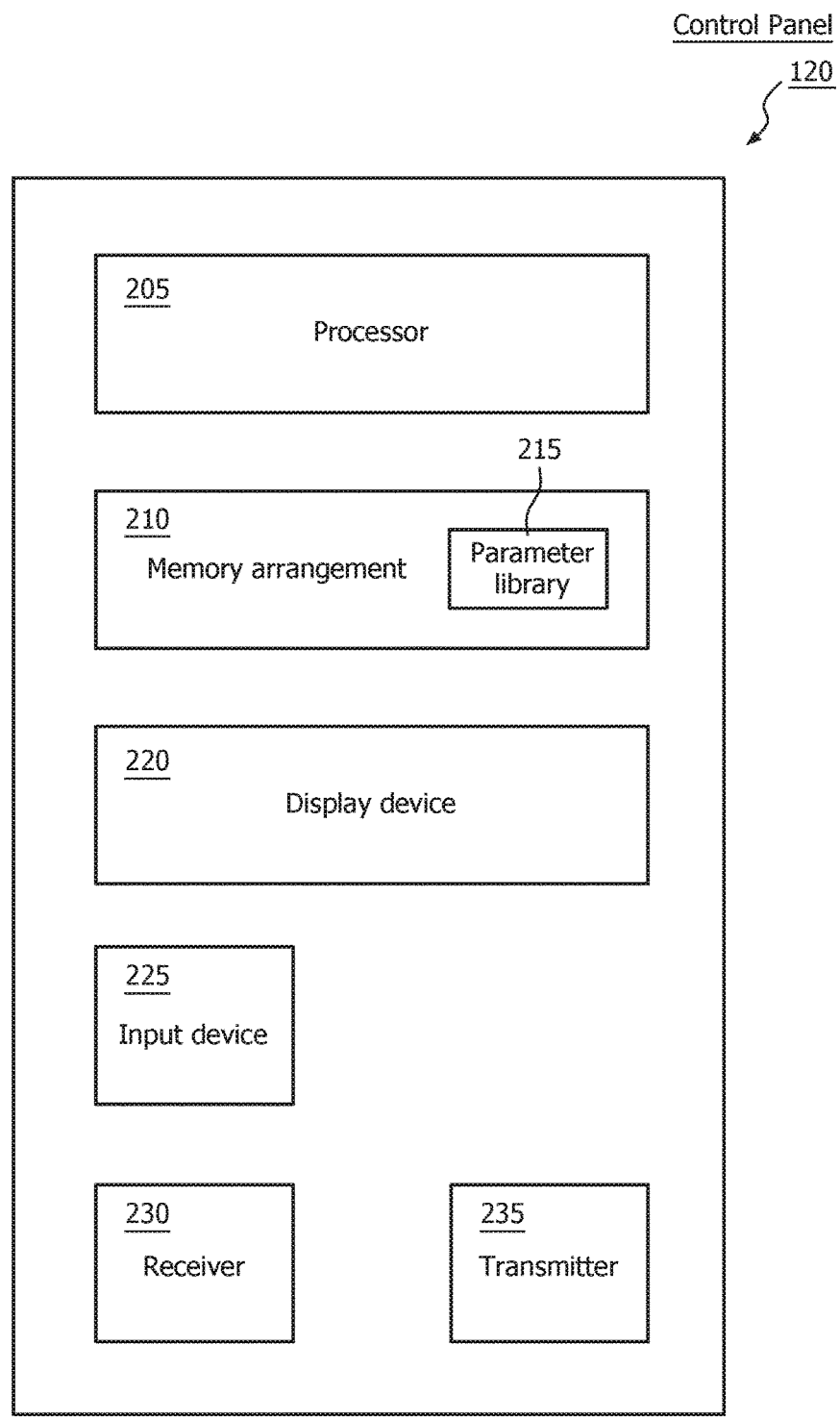
FIG. 2 shows a control panel for a MRI device according to the exemplary embodiments.

FIG. 2 shows an exemplary control panel 120 for the MRI device 110 according to the exemplary embodiments. As discussed above, the components of the scan room 100 may be associated with a network. Accordingly, the control panel 120 includes a receiver 230 and a transmitter 235. However, it should be noted that the control panel 120 may include a combined transceiver to provide the functionalities of the receiver 230 and the transmitter 235. The receiver 230 and the transmitter 235 may be for a wireless connection. However, the control panel 120 may also be configured for a wired connection in which the receiver 230 and the transmitter 235 may be connected to a port to receive the wired connection.

Also as discussed above, the control panel 120 is configured to generate the model of the patient from the data received from the imaging sensors 140 and the weight sensor 145. It is noted that the model generation is not limited to using image data and weight data. Other data that may be determined from the patient or that has been previously stored for the patient may be used to generate the patient model. The control panel 120 includes a processor 205 and a memory arrangement 210. The receiver 230 receives the data from the imaging sensors 140 and the weight sensor 145 and forwards the data to the processor 205 and is stored in the memory arrangement 210. The memory arrangement 210 includes a parameter library 215. The parameter library 215 includes pre-calculated sensible default parameters. That is, the parameter library 215 is a table of data from which the captured images and the weight data of the patient is referenced for the processor 205 to generate the model of the patient. For example, the dimensions of an arm may be determined from the captured images. The parameter library 215 indicates that the given set of dimensions of the arm results in a pre-calculated rendering of the arm on the model. The parameter library 215 may be pre-programmed into the control panel 120. The parameter library 215 may also be updated in a controlled manner (e.g., manually) or dynamically (e.g., subsequent to each generation of the model) to more accurately determine the pre-calculated parameters for subsequent generations of the models of patients.

Upon rendering of the model of the patient, the control panel 120 shows the model on a display device 220. The display device 220 may be a touch screen to enable the user to select a predetermined area of the model that corresponds to a portion of the body of the patient in which the imaging scan is to be performed. The control panel 120 may include an input device 225 to also select the predetermined area. When the display device 220 is a touch screen, the display device 220 may incorporate the input device 225. The input device 225 may also include conventional input keys (e.g., patient table 115 movement keys). Upon selecting the predetermined area, the isocenter of that area is determined for the imaging scan. Subsequently, when the patient lies down/ is lying on the patient table 115, the patient table 115 is moved within the MRI device 110 until the isocenter is reached.

According to an exemplary embodiment, the control panel 120 receives the patient data (e.g., captured images, weight measurement, etc.) for pre-processing by the processor 205. For example, the pre-processing relates to detecting a size, detecting a gender, determining a weight, identifying the patient, preparing an exam, requesting automatic picture archiving and communication system (PACS) data, performing a gross registration of data based on camera data, etc. The processor 205 subsequently generates the model of the patient as a function of the data stored in the parameter library 215. Once the model of the patient is shown on the display device 220, the operator selects the scan region (e.g., point, drag, pinch-to-zoom functionality if the display device is a touch screen) and provides other protocol parameters (e.g., the type of imaging scan to be performed). During this process, the patient lies down on the patient table 115. The imaging sensors 140 are further configured to record the patient position data after lying down so that the patient is automatically moved to the isocenter. While the patient is moved on the patient table 115, the operator is allowed to leave the room and enter the operator room 125 via the access door 130. The operator may utilize the imaging device 135 to perform the imaging scans of the patient at the isocenter.

The control panel 120 is further configured to request further data or provide feedback to the operator. For example, as discussed above, the control panel 120 may request the PACS data. The control panel 120 may also determine whether further data is required for the rendering of the model. For example, the processor 205 is configured to determine whether sufficient amount of data is received from the imaging sensors 140/weight sensor 145 to generate the model. If at least one further datum is required, the control panel 120 prompts the operator to provide the missing data. The control panel 120 also provides feedback to the operator. For example, if the control panel 120 determines that the captured images do not provide sufficient data to generate the model, the control panel 120 prompts the operator to request that the patient stand in a particular pose for the imaging sensors 140 to capture the necessary data to generate the model. In another example, the control panel 120 is configured to detect safety issues. In a particular scenario, the patient may be positioned such that an extremity forms a loop. For example, a patient may lie down and the patient's hand may touch the patient's thigh, forming a loop. Such a loop may give rise to current flow and may further cause burns. Therefore, the control panel 120 provides a warning accordingly. The control panel 120 is further configured to determine whether the imaging scan is allowed to be performed. For example, the imaging sensors 140 determine whether the operator or any other personnel has left the scan room 100 (e.g., by entering the operator room 125) prior to the start of the scan.

In view of the above description, the time required to prepare the patient for the imaging scan is reduced. Specifically, the time that would otherwise be used by the operator to manually prepare the MRI device 110 is substantially eliminated. The workflow of preparing the MRI device 110 is also more efficient as some necessary steps are parallelized and through suggesting sensible default parameters based on camera image information.

Figure 3:
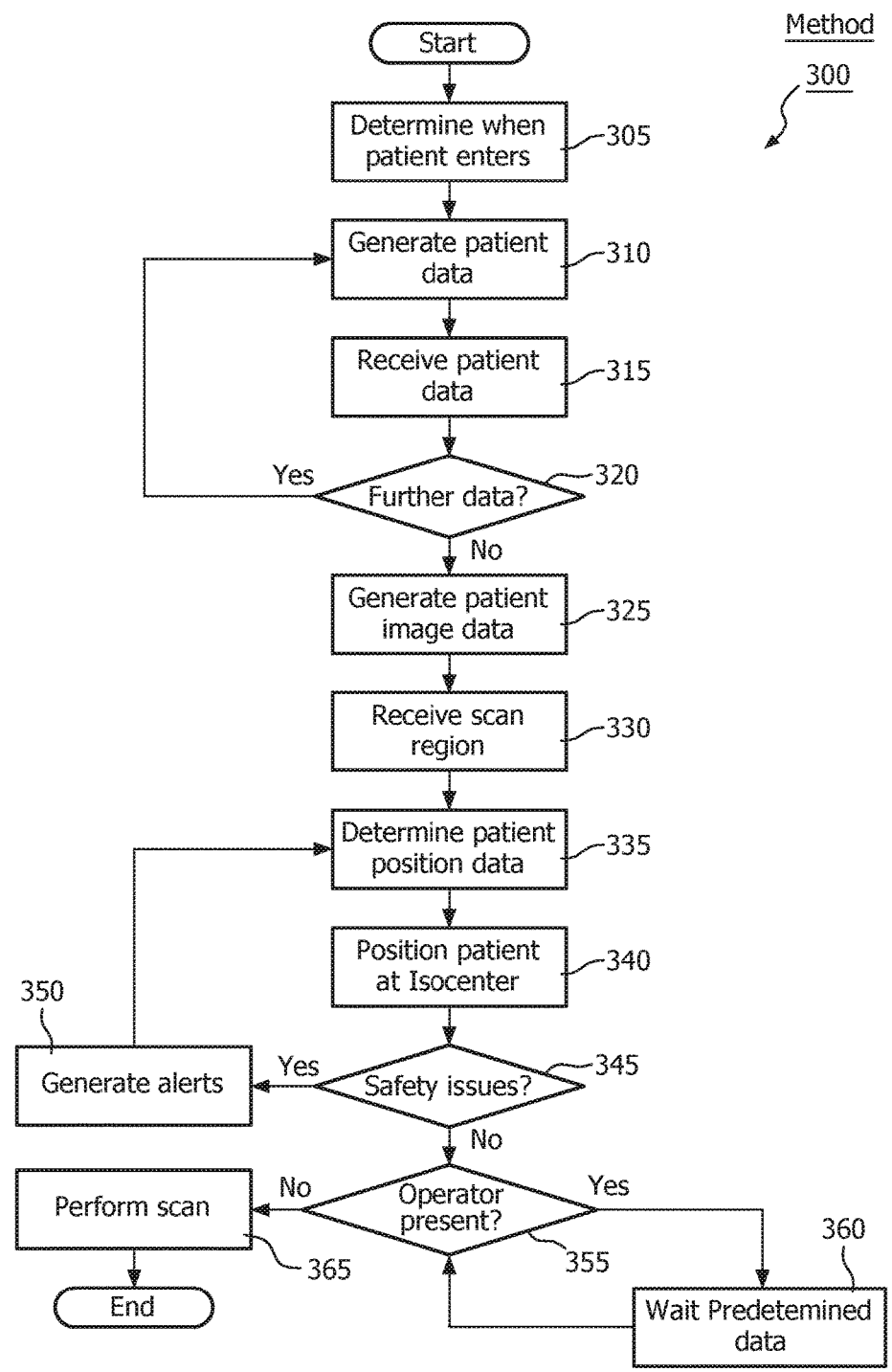
FIG. 3 shows a method of preparing a patient in a scan room according to the exemplary embodiments.

FIG. 3 shows an exemplary method 300 of preparing a patient in the scan room 100 according to the exemplary embodiments. Specifically, the method 300 relates to a pre-scan of the patient to generate patient data used for a pre-processing thereof in order to prepare the patient for an imaging scan. The method 300 will be described with reference to the scan room 100 of FIG. 1 and the control panel 120 of FIG. 2.

In step 305, the imaging sensors 140 determine when the patient enters the scan room 100. As discussed above, the imaging sensors 140 may automatically determine when the patient enters or the operator may determine when the patient enters to activate the imaging sensors 140. In step 310, the imaging sensors 140 and the weight sensor 145 generate the patient data. Specifically, the imaging sensors 140 capture images of the patient while the weight sensor 145 determines the weight of the patient. As discussed above, additional sensors such as heat sensors, light sensors, depth sensors, etc. may generate patient data. In step 315, the control panel 120 receives the patient data via the receiver 230.

In step 320, a determination is made whether further data is required. If further data is required, the method 300 returns to step 310 where additional patient data is generated. The method 300 may include an optional step in which the control panel prompts the operator to enter the additional patient data. Once all the necessary patient data is received by the control panel 120, the method 300 continues to step 325. In step 325, the model of the patient is generated by the control panel 120. Specifically, a patient image data in the form of the model is shown on the display device 220 of the control panel 120.

In step 330, the control panel 120 receives the scan region on the model shown on the display device 220. As discussed above, the control panel 120 may be a touch screen in which the operator may point and drag the scan region to the desired location. The operator may also utilize the input device 225 to enter the desired location. In step 335, the imaging sensors 140 determine patient position data. Specifically, the imaging sensors 140 determine the position of the patient upon lying on the patient table 115. In step 340, the patient is positioned at the isocenter as a function of the selected scan region. That is, the patient table 115 is retracted into the MRI device 110 such that the isocenter is reached.

In step 345, a determination is made whether any safety issues are present. For example, the imaging sensors 140 may determine that the patient is not lying correctly on the patient table 115. If a safety issue exists, the method 300 continues to step 350 where an alert is generated for the respective safety issue. The method 300 returns to step 335 to determine the patient position data until no further safety issues are determined in step 345. In step 355, a determination is made whether the operator is still present in the scan room 100. That is, the determination relates to whether the operator has moved into the operator room 125. If the operator is still present, the method 300 continues to step 360. In step 360, the control panel 120 waits a predetermined time period. The method 300 returns to step 355 when another determination is made whether the operator is still present in the scan room 100. Once the operator has left the scan room, the method 300 continues to step 365. In step 365, the imaging scan is performed.

According to the exemplary embodiments, the system and method provide a pre-scan of a patient to generate patient data used for a pre-processing thereof. Specifically, the pre-processing provides a preparation of the patient in order for an imaging scan to be performed. The pre-scan is performed using a plurality of sensors such as imaging sensors, weight sensor, heat sensor, light sensor, depth sensor, etc. The patient data is used to generate a model of the patient to be shown on a control panel. The operator can select a scan region from the displayed model. The scan region determines the isocenter for the imaging scan such that the patient is moved into the MRI device 110 via the patient table 115 to the isocenter. The exemplary embodiments allow for a more efficient manner to prepare the patient for the imaging scan, particularly by reducing an overall time necessary for the preparation.

Those skilled in the art will understand that the above described exemplary embodiments may be implemented in any number of manners, including, as a separate software module, as a combination of hardware and software, etc. For example, the generation of the model of the patient may be a program containing lines of code that, when compiled, may be executed on a processor.

It will be apparent to those skilled in the art that various modifications may be made in the present invention, without departing from the spirit or the scope of the invention. Thus, it is intended that the present invention cover modifications and variations of this invention provided they come within the scope of the appended claims and their equivalent.

What is claimed is:

1. A method, comprising:
   receiving, by a control panel, patient data generated by a weight sensor and at least one additional sensor, the patient data corresponding to dimensions of a body of a patient;
   generating, by the control panel, model data as a function of the patient data, the model data representing the body of the patient;
   receiving, by the control panel, a target location on the model data, the target location corresponding to a desired position on the body of the patient for performing an imaging scan; and
   determining, by the control panel, an isocenter for the imaging scan as a function of the target location.

2. The method of claim 1, wherein the patient data is at least one captured image of the patient.

3. The method of claim 1, wherein the model data is a three-dimensional representation of the body of the patient.

4. The method of claim 3, further comprising:
   displaying the model data on a display device of the control panel.

5. The method of claim 1, wherein the model data is generated as a function of pre-calculated parameters.

6. The method of claim 1, further comprising:
   prior to determining the isocenter, receiving, by the control panel, position data of the patient on a patient table.

7. The method of claim 1, further comprising: determining, by the control panel, whether further patient data is required to generate the model data; and
   requesting, by the control panel, the further patient data.

8. The method of claim 7, wherein the further patient data is received by the control panel at least one of manually from an operator and automatically by the at least one additional sensor.

9. The method of claim 1, wherein the at least one additional sensor is selected from the group consisting of an imaging sensor, a heat sensor, a light sensor, a depth sensor.

10. The method of claim 1, further comprising:
    determining, by the control panel, whether an operator is present in a scan room prior to performing the imaging scan.

11. A control panel, comprising:
    a processor configured to receive patient data generated by a weight sensor and at least one additional sensor, the patient data corresponding to dimensions of a body of a patient, the processor configured to generate model data as a function of the patient data, the model data representing the body of the patient;
    a memory arrangement configured to store the patient data and the model data; and
    an input device configured to receive a target location on the model data, the target location corresponding to a desired position on the body of the patient for performing an imaging scan,
    wherein the processor determines an isocenter for the imaging scan as a function of the target location.

12. The control panel of claim 11, wherein the patient data is at least one captured image of the patient.

13. The control panel of claim 11, wherein the model data is a three-dimensional representation of the body of the patient.

14. The control panel of claim 13, further comprising:
    a display device configured to display the model data.

15. The control panel of claim 11, wherein the model data is generated as a function of pre-calculated parameters.

16. The control panel of claim 11, wherein, prior to determining the isocenter, the processor receives position data of the patient on a patient table.

17. The control panel of claim 11, wherein the processor is configured to determine whether further patient data is required to generate the model data and request the further patient data.

18. The control panel of claim 17, wherein the processor is configured to receive the further patient data at least one of manually from an operator via the input device and automatically by the at least one additional sensor.

19. The control panel of claim 11, wherein the at least one additional sensor selected from the group consisting of an imaging sensor, a heat sensor, a light sensor, a depth sensor.

20. A system, comprising:
    a weight sensor and at least one additional sensor disposed in a scan room configured to generate patient data indicative of dimensions of a body of a patient;
    a control panel, comprising:
    a processor configured to receive the patient data, the processor configured to generate model data as a function of the patient data, the model data representing the body of the patient;
    a memory arrangement configured to store the patient data and the model data; and
    an input device configured to receive a target location on the model data, the target location corresponding to a desired position on the body of the patient for performing an imaging scan; and
    a scanning device configured to perform the imaging scan,
    wherein the processor determines an isocenter for the imaging scan as a function of the target location.

* * * * *